US008817536B2

(12) United States Patent
Scade et al.

(10) Patent No.: US 8,817,536 B2
(45) Date of Patent: Aug. 26, 2014

(54) CURRENT CONTROLLED RECALL SCHEMA

(75) Inventors: Andreas Scade, Dresden (DE); David Still, Colorado Springs, CO (US); James Allen, Colorado Springs, CO (US); Jay Ashokkumar, Colorado Springs, CO (US); Jaskarn Singh Johal, Mukilteo, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 991 days.

(21) Appl. No.: 12/006,228

(22) Filed: Dec. 31, 2007

(65) Prior Publication Data
US 2008/0232167 A1 Sep. 25, 2008

Related U.S. Application Data

(60) Provisional application No. 60/919,372, filed on Mar. 22, 2007.

(51) Int. Cl.
*G11C 14/00* (2006.01)
*G11C 11/00* (2006.01)

(52) U.S. Cl.
CPC ............ *G11C 14/00* (2013.01); *G11C 14/0063* (2013.01)
USPC ........................ 365/185.08; 365/154; 365/156

(58) Field of Classification Search
USPC ..................................... 365/154, 156, 185.08
See application file for complete search history.

(56) References Cited

U.S. PATENT DOCUMENTS

| 5,065,362 | A | | 11/1991 | Herdt et al. | |
|---|---|---|---|---|---|
| 5,602,776 | A | * | 2/1997 | Herdt et al. | 365/185.08 |
| 5,682,345 | A | * | 10/1997 | Roohparvar et al. | 365/185.04 |
| 5,774,400 | A | | 6/1998 | Lancaster et al. | |
| 5,892,712 | A | * | 4/1999 | Hirose et al. | 365/185.07 |
| 5,914,895 | A | | 6/1999 | Jenne | |
| 6,026,018 | A | * | 2/2000 | Herdt et al. | 365/185.07 |
| 6,097,629 | A | * | 8/2000 | Dietrich et al. | 365/185.07 |
| 6,141,247 | A | * | 10/2000 | Roohparvar et al. | 365/185.08 |
| 6,363,011 | B1 | | 3/2002 | Hirose et al. | |
| 6,414,873 | B1 | * | 7/2002 | Herdt | 365/185.08 |
| 6,965,524 | B2 | * | 11/2005 | Choi | 365/185.08 |
| 7,020,007 | B2 | | 3/2006 | Kwon | |
| 7,085,170 | B2 | | 8/2006 | Mihnea et al. | |
| 7,110,293 | B2 | | 9/2006 | Jung | |
| 7,164,608 | B2 | * | 1/2007 | Lee | 365/189.05 |
| 7,336,534 | B2 | * | 2/2008 | Jung | 365/185.08 |
| 7,355,897 | B2 | | 4/2008 | Hsu et al. | |
| 7,385,857 | B2 | * | 6/2008 | Dalton | 365/185.29 |
| 7,505,303 | B2 | * | 3/2009 | Ashokkumar et al. | 365/154 |
| 7,518,916 | B2 | * | 4/2009 | Ashokkumar et al. | 365/185.07 |
| 2005/0139902 | A1 | * | 6/2005 | Jung | 257/324 |
| 2006/0193174 | A1 | * | 8/2006 | Choi et al. | 365/185.08 |

OTHER PUBLICATIONS

USPTO Notice of Allowance for U.S. Appl. No. 11/644,196 dated Jan. 30, 2008; 7 pages.

(Continued)

*Primary Examiner* — Son Mai

(57) ABSTRACT

A memory circuit includes a controlled current source coupled to an input to a nonvolatile cell, and a second controlled current source coupled to a volatile cell, the volatile cell coupled to receive current from the controlled current source via the nonvolatile cell.

11 Claims, 4 Drawing Sheets

(56) References Cited

OTHER PUBLICATIONS

U.S. Appl. No. 11/644,196: "Non-Volatile, Static Random Access Memory with Regulated Erase Saturation and Program Window," David Dalton; 45 pages.
USPTO Notice of Allowance for U.S. Appl. No. 11/644,447 dated Oct. 31, 2008; 7 pages.
U.S. Appl. No. 11/644,447: "Method and Apparatus to Create an Erase Disturb on a Non-Volatile Static Random Access Memory Cell," Ashokkumar et al.; 28 pages.
USPTO Notice of Allowance for U.S. Appl. No. 11/644,819 dated Dec. 4, 2008; 7 pages.
U.S. Appl. No. 11/644,819: "Method and Apparatus to Program Both Sides of a Non-Volatile Static Random Access Memory," Ashokkumar et al.; 29 pages.

* cited by examiner

CURRENT CONTROLLED RECALL SCHEMA

PRIORITY CLAIM

The present application claims priority to the U.S. provisional patent application titled RECALL SCHEMA, having application No. 60/919,372, filed on Thursday, Mar. 22, 2007, which is incorporated herein by reference.

TECHNICAL FIELD

The present disclosure relates to memory circuits.

BACKGROUND

In high density memory circuits, very low recall currents and other factors can sometimes lead to false, premature latching by the volatile memory cell. Techniques to boost the recall currents are one solution, but false latching may still occur when the larger recall currents cause imbalanced potentials in the volatile latch.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Figure 1:
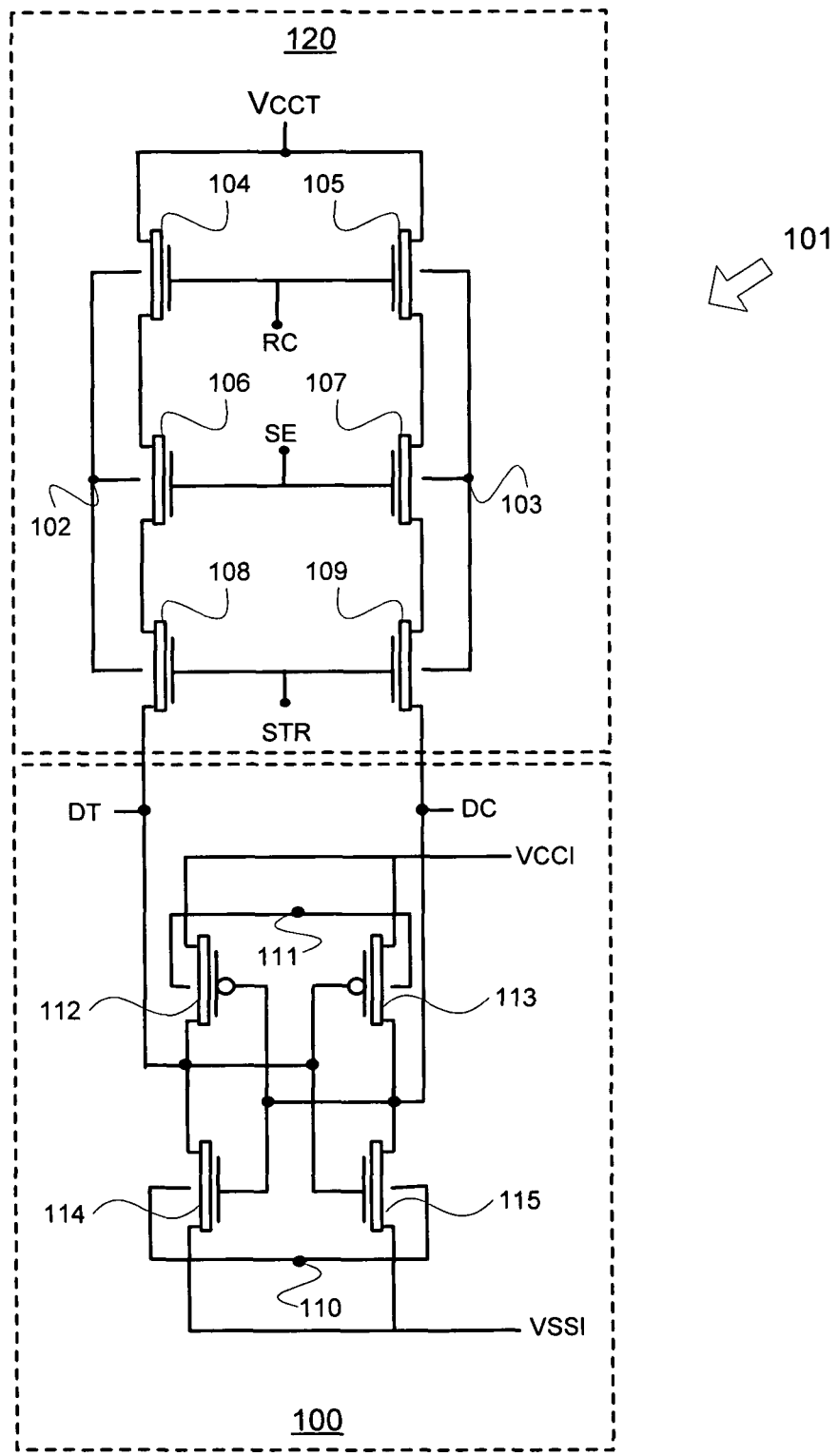
FIG. 1 illustrates a memory cell comprising an SRAM cell coupled to a non-volatile memory cell.

FIG. 1 illustrates a memory cell comprising an SRAM cell 100 coupled to a non-volatile memory cell 120, hereinafter referred to as an nvSRAM cell 101. An nvSRAM memory device typically includes a plurality of nvSRAM cells that are integrated with a controller onto a single semiconductor chip to form an array.

Generally, an nvSRAM cell 101 comprises a plurality of n-channel, Field-Effect Transistors (FETs); a plurality of nonvolatile elements, such as nonvolatile transistors (SONOS) or capacitors; and a plurality of resistors. It should, however, be appreciated that other types of transistors, such as p-channel FETs, and combinations of different types of transistors can be utilized.

The nvSRAM cell 101 is comprised of a static random access memory (SRAM) cell 100 that is capable of communicating a bit of data to and from an exterior environment and a non-volatile (nv) cell 120 for providing nonvolatile backup storage to the SRAM cell 100. The SRAM cell 100 is capable, as long as power is being provided, of receiving a bit of data from an exterior environment, retaining the bit of data, and transmitting the bit of data back to the exterior environment. If, however, power is removed from the SRAM cell 100, the SRAM cell 100 will lose the bit of data. The nv cell 120 prevents loss of the bit of data by providing the capability to receive the bit of data from the SRAM 100, retain the bit of data in the absence of power being provided to the SRAM cell 100, and return the bit of data to the SRAM cell 100 when power is restored. For example, the bit of data can be transferred from the SRAM cell 100 to the nv cell 120 in a STORE operation. At a later time, the bit of data can be returned from the nv cell 120 to the SRAM cell 100 in a RECALL operation. The SRAM cell 100 can then transmit the bit of data to the exterior environment, if desired.

Typically, the nvSRAM cell 101 is combined with other nvSRAM cells to form a memory array that is integrated onto a single semiconductor chip. Typical memory array embodiments comprise 1 Mbyte or 4 Mbytes of nvSRAM cells. One motivation for creating integrated semiconductor chips with ever larger arrays of nvSRAM cells is that the area per cell decreases as more cells are integrated onto a chip. For example, four chips, each with arrays of 262,144 nvSRAM cells (an array of 512×512), occupy a greater surface area than a single chip with an array of 1,048,576 nvSRAM cells (1 Mbyte, an array of 1024×1024). The area occupied by a memory chip is important because many applications for the chip, such as personal computers, are continually attempting to provide more memory in less space.

In the illustrated embodiment, the volatile portion 100 is a Static Random Access Memory (SRAM) cell. Four transistors of the cell are shown. Typical embodiments include two other "pass" transistors (not shown here) to couple and decouple the internally stored bit information to external interfaces (such as bit lines). The word 'static' indicates that the memory retains its contents as long as power remains applied. Random access means that locations in the memory can be written to or read from in any order, regardless of the memory location that was accessed last.

Each bit in the SRAM cell 100 is stored, along with its complement value, on four transistors that form two cross-coupled inverters. The SRAM cell has two stable states, which are used to denote a logical 0 and a logical 1. Two additional transistors (not shown) may serve to control external access to the SRAM bits during READ and WRITE operations. The first cross coupled inverter formed by transistors 112, 114 and the second cross coupled inverter formed by transistors 113, 115 reinforce each other to retain charges representing a volatile bit at node DT (the 'true' node) and the complement of that volatile bit at node DC (the 'complement' node).

The output of the first inverter DT is coupled to the input of the second inverter and the output of the second inverter DC is coupled to the input of the first inverter. The configuration of the first and second inverters form a latch in the SRAM cell 100. The 'bulk' region of the p-type transistors 112, 113 may be tied to Vcc (logical high), and the bulk region of the n-type transistors 114, 115 may be tied to Vss (e.g. logical low or ground).

The nonvolatile cell 120 includes a first silicon oxide nitride oxide semiconductor (SONOS) FET 106 and a second SONOS FET 107 for respectively backing up the 'true' and 'complement' bits of the SRAM cell 100. The state of SRAM cell 100 is stored by the first and second SONOS FETs 106, 107 by performing a STORE operation. This may be accomplished by applying a high (higher than logical 1) voltage at node SE (the gates of SONOS FETs 106, 107). It should be appreciated that the SONOS FETs 106, 107 can be replaced with other types of nonvolatile storage elements, such as silicon nitride oxide semiconductor (SNOS) transistors, floating gate transistors, and capacitors, to name a few.

The nonvolatile cell 120 further includes a transistors 108, 109 that operate as switches during STORE and RECALL operations to appropriately configure the nonvolatile cell 120 for the transfer of a bit of data between the volatile cell 100 and the nonvolatile cell 120. More specifically, the transistors 108, 109 function to connect the nonvolatile cell 120 to the volatile cell 100 during STORE and RECALL operations and to otherwise disconnect the two cells. The state of the transistors 108, 109 is controlled by signal at node STR. More specifically, if STR is low, the transistors 108, 109 are turned off to disconnect the nonvolatile cell 120 from the volatile cell 100. Conversely, if STR signal is high, the transistors 108, 109 are on to connect the nonvolatile cell 120 to the volatile cell 100. The nonvolatile cell 120 further includes transistors 104, 105 that function as switches to place the nonvolatile cell 120 in the appropriate configuration for transferring a bit of data from the nonvolatile cell 120 to the volatile cell 100 during RECALL operations. More specifically, the transistors 104, 105 function to connect the nonvolatile cell 120 to node VCCT during a RECALL operation and to disconnect the nonvolatile cell 120 from VCCT otherwise. The transistors 104, 105 are typically turned off during a STORE operation. The state of the transistors 104, 105 is controlled by a signal that is applied to node RC. More specifically, if RC signal is low, the transistors 104, 105 are turned off, to disconnect the nonvolatile cell 120 from VCCT. Conversely, if RC is high, the transistors 104, 105 are turned on to connect the nonvolatile cell 120 to VCCT.

A RECALL operation may begin by clearing the existing SRAM data, for example by discharging external bit lines (not shown), clamping node VCCI to node VSSI, and then coupling nodes DT and DC to the external bit lines. In this manner the nodes DT and DC, which store the volatile state, may be discharged to ground (e.g. Vss). The nodes DT and DC are then decoupled from the external bit lines. Both nodes STR and RC are driven high, providing a charging path to DT and DC through the nonvolatile cell 120 from the power supply node VCCT. With SE held low and assuming the last STORE operation left SONOS transistor 106 in an 'erased' state (representing storage of a logical 1) and SONOS transistor 103 in a 'programmed' state (representing storage of a logical 0), and assuming that the erase threshold is −1 V and the program threshold is +1V, the SONOS transistor 106 will conduct current while the SONOS transistor 103 will not because its gate voltage is below its threshold voltage. Node DT charges up to logical high, while node DC remains at logical low, thereby reestablishing in the volatile cell 100 the data corresponding to the last STORE cycle. The RECALL operation may be completed by powering up the SRAM and returning all control lines to their default states.

One potential problem during RECALL is that the volatile cell 100 may latch prematurely, capturing a state that does not represent the state of the nonvolatile cell 120. Many factors may contribute to pre-latching, among them a weak current flow through the 'erased' nonvolatile charge storage transistor (due for example to drift in the transistor's threshold voltages and other factors), leakage current through the 'programmed' nonvolatile charge storage, and, mainly, transistor mismatch. The transistors of the SRAM bitcell are not designed to follow the rules of a highly accurate analog amplifier. They have a large mismatch due to channel length variation and threshold voltage variation. Conventional recall schemas react to the mismatch of nearly all transistors of the nvSRAM bitcell. The approach described herein "switches" six of these transistors electrically off during recall, making it more efficient.

Pre-latching occurs when combined effects act to cause the voltages at VCCI and VSSI to pre-maturely separate by too great an amount, before the actual state of the nonvolatile cell 120 is re-enforced in the volatile cell 100. This may occur when imbalances in the volatile cell 100 temporarily overpower the driving effects of the nonvolatile cell 120.

To alleviate these problems somewhat, the RECALL process may be modified in some embodiments, as follows. The volatile cell 100 is discharged as described above, driving DT and DC at or close to ground level. VCCI is clamped to VSSI at a voltage level near ground. The voltage at SE is driven down to a negative value, for example −1V, to help ensure the transistors 102 and 103 are both off. Next, the RECALL from the nonvolatile cell 120 is activated, by turning RC and STR on. The voltage at SE is ramped from a negative to a positive value, for example from −1V to 1V. Current will now flow thru one of the transistors 106, 107 that is in an erased state (storing a logical 1). The SRAM node supplied by the transistor that is on, either DT or DC, will charge up to a voltage comparable to VCCT (less the voltage drop across the nonvolatile cell 120). VCCI is unclamped from VSSI and the SRAM cell is recharged.

The above modification in the RECALL process may act to reduce pre-latching by reducing the effects of leakage current from the 'programmed' transistor and by making the current flow from the 'erased' transistor more robust. This may result in the nonvolatile cell 120 driving the volatile cell 100 more strongly toward a proper representative state, reducing the likelihood of pre-latching.

However, another problem may arise if the above modifications cause a RECALL current into the volatile cell 100 that is too strong. As previously discussed, VCCI and VSSI may be clamped together (electrically connected to conduct current between them) in order to alleviate voltage imbalances between the two nodes that can lead to pre-latching. However, the clamping is typically performed with a transistor (such as an enhancement mode CMOS transistor) which has some impedance. This impedance in the clamp transistor may cause an increasing voltage differential between VCCI and VSSI as the current flowing through the clamping transistor, Icmp, increases. If this voltage differential becomes too great, pre-clamping may occur. The current Icmp flowing through the clamping transistor is typically proportional to the current flowing into the volatile cell 100 from the nonvolatile cell 120 during RECALL.

Figure 2:
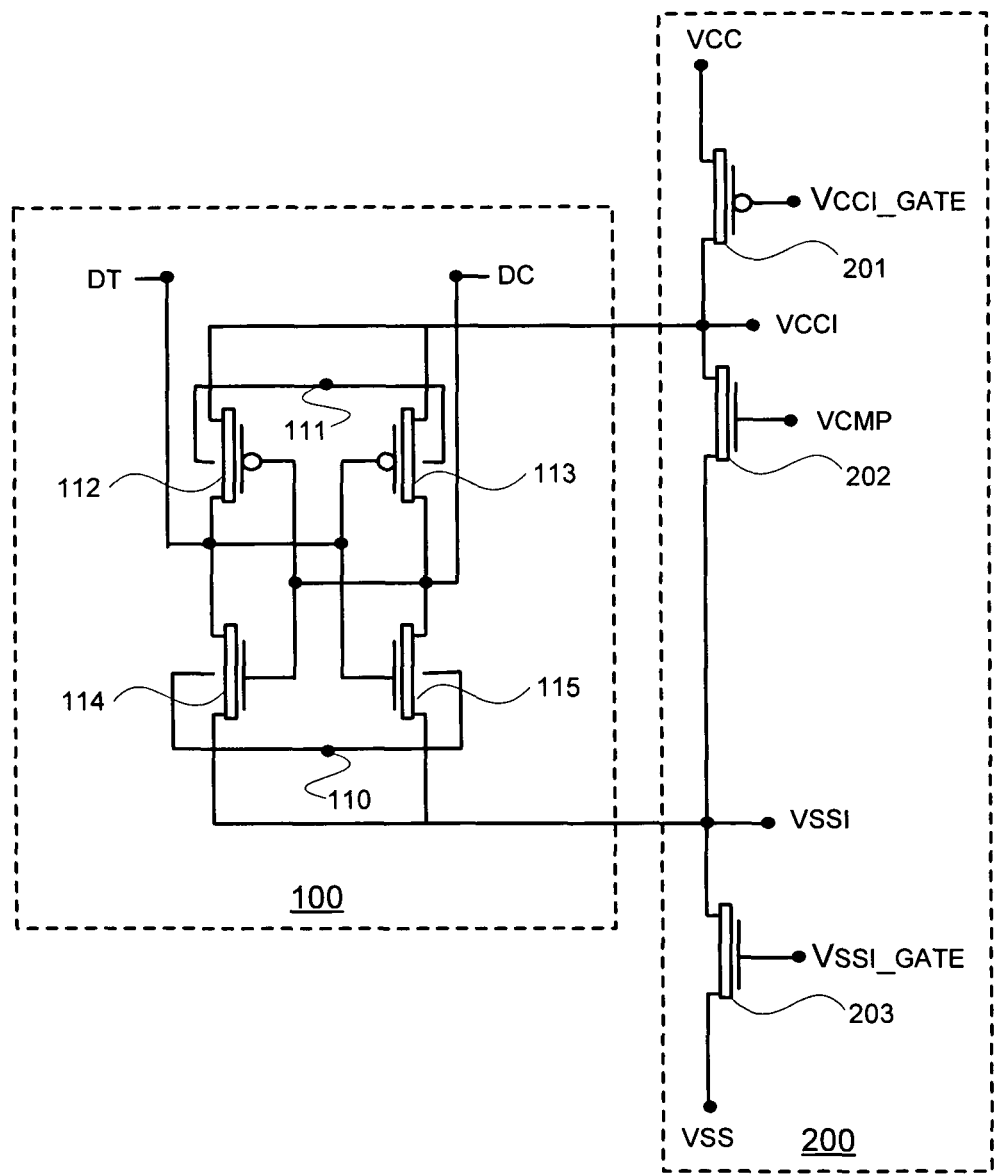
FIGS. 2 and 3 are illustrations of embodiments of a current-controlled RECALL scheme.
Figure 3:
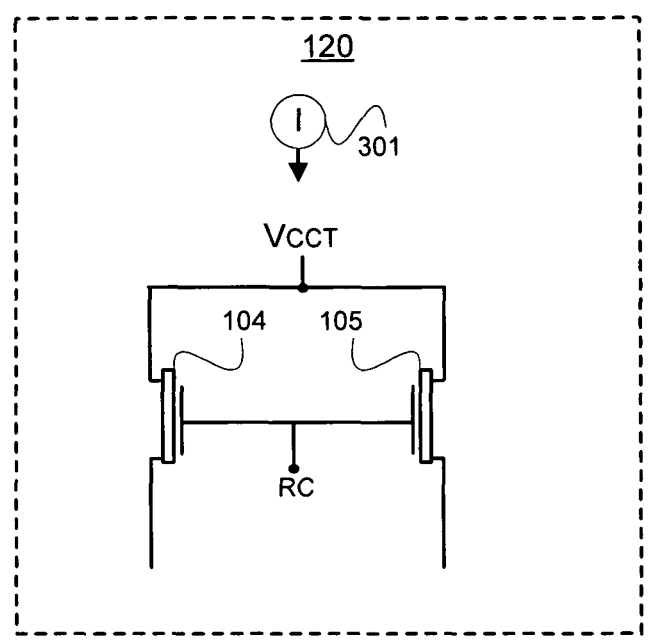

FIGS. 2 and 3 are illustrations of embodiments of a current-controlled RECALL scheme. A current regulating circuit 200 is coupled to VCCI and VSSI in order to alleviate conditions that can lead to pre-latching. Furthermore, a controlled current source 301 may be provided in place of a voltage source at VCCT, increasing the robustness of the current driven from the nonvolatile cell 120 to the volatile cell 100 during RECALL.

The current regulator 200 may comprise transistors 201, 202, and 203. Transistor 203 is controlled by a gate voltage Vssi_gate, and may be operated during RECALL to clamp VSSI close to ground (Vss) potential. Transistor 202 is controlled by a gate voltage Vcmp, and may be operated during RECALL to clamp VCCI close to the potential at VSSI. Thus, during RECALL, VCCI and VSSI may be held close to one another in potential, until the state of the nonvolatile cell 120 is represented in the volatile cell 100 (causing a small differential between VSSI and VCCI), at which point the clamping may be removed, the volatile cell 100 is recharged, and VCCI and VSSI float to a wider and more stable differential reflecting the state of the nonvolatile cell 120.

Transistor 201, which is controlled by a gate voltage Vcci_gate, may act to further regulate the voltage differential and hence the current Icmp between VCCI and VSSI during RECALL. In one embodiment, transistor 201 is a p-type CMOS transistor. Transistor 201 may be operated as a weak pull up device to further control the current between VCCI and VSSI.

With the use of transistor 201, ramping of the voltage at SE during RECALL may be reduced or eliminated. Ramping SE from a negative to a positive voltage has the effect of gradually turning on the storage transistor having an erased state. This urges the potentials at the two nodes VCCI and VSSI of the volatile cell 100 to start to separate in the correct direction. Transistor 201 may be operated to limit the current through the volatile cell 100, which in affect controls the separation rate of VCCI and VSSI and also affects the speed at which the RECALL may be completed by successfully representing the state of the nonvolatile cell 120 in the volatile cell 100. SE may instead be set to a voltage level high enough to ensure the charge storage transistor that stores a '1' is turned on, and vice versa (or at least turned on more than the transistor storing a '0'). The nodes VCCI and VSSI may start to separate without ramping SE, because the volatile cell 100 floats up or down to the relative threshold of SE. This makes for a more robust recall, which is easier to control.

The current to the volatile cell 100 from the nonvolatile cell 120 may also be controlled. A controlled current source 301 at VCCT may provide a controlled source of current during RECALL.

The rate at which the signals STR and RC are changed from their lowest to highest values (and/or vice versa) may be controlled in order to prevent sudden spikes in current demand on the current source 301 when large numbers of cells are RECALLED simultaneously.

Figure 4:
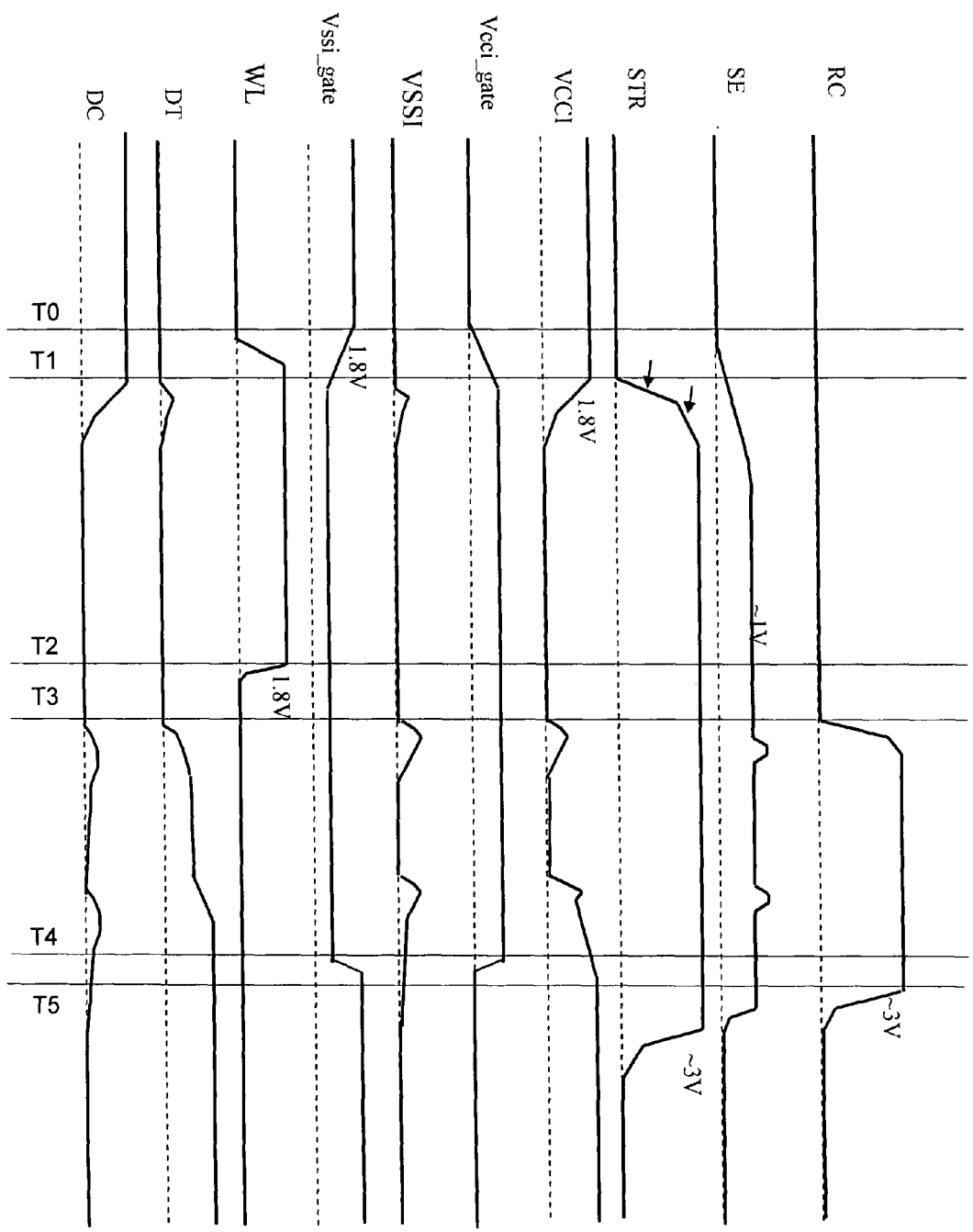
FIG. 4 is a timing diagram of an embodiment of signaling to control current during RECALL.

FIG. 4 is a timing diagram of an embodiment of signaling to control current during RECALL. VCCI is held at approximately Vcc by the depletion mode transistor 201 (Vcci_gate low, t<T0). VSSI is held at approximately Vss by the enhancement mode transistor 203 (Vssi_gate high, t<T0). VCCI and VSSI are clamped and pulled down to a value close to Vss, and the volatile cell is discharged (T0<t<T2. Vcci_gate and Vssi_gate are set to values that keep the voltage potential low between VCCI and VSSI (T0<t<T4). The nonvolatile cell 120 is turned on (RC high, SE low positive voltage, STR high, T1<t<T5) and charging of DT and DC nodes from current from the nonvolatile cell 120 begins. The nonvolatile state is latched in the volatile cell 100, VCCI and VSSI are unclamped, and the nonvolatile cell is turned off (RC, SE, and STR brought low, t>T5).

In one embodiment, the voltage SE at the gates of the nonvolatile charge storage transistors 106, 107 may be dynamically adjusted during RECALL to reduce current detected flowing through the current regulator 200. This current to gate voltage feedback loop may have the effect of further stabilizing the RECALL process.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory circuit comprising:
   a first controlled current source coupled to an input to a nonvolatile cell; and
   a second controlled current source coupled to a volatile cell, the volatile cell coupled to receive current from the first controlled current source via the nonvolatile cell;
   the first controlled current source providing a substantially constant amount of current to the volatile cell notwithstanding changes in an impedance of the load presented by one or more of the volatile cell and the nonvolatile cell.

2. The memory circuit of claim 1, wherein the second controlled current source coupled to a volatile cell further comprises:
   the second current source coupled to reduce potentials between at least two nodes of a latch of the volatile cell.

3. The memory circuit of claim 1, wherein the second controlled current source coupled to a volatile cell further comprises:
   at least one pull up transistor and at least one pull down transistor.

4. A RECALL process to cause the state of a nonvolatile memory cell to be represented in a volatile memory cell comprising:
   applying a current regulator to prevent premature latching of bit values by a volatile memory cell during a RECALL operation from a nonvolatile memory cell to the volatile memory cell;
   the current regulator providing a substantially constant amount of current to the volatile cell notwithstanding changes in an impedance of the load presented by one or more of the volatile cell and the nonvolatile cell.

5. The RECALL process to cause the state of a nonvolatile memory cell to be represented in a volatile memory cell of claim 4, wherein applying a current regulator to prevent premature latching of bit values by a volatile memory cell further comprises:
   applying the current regulator to balance a potential between two nodes of a latch of the volatile memory cell.

6. The RECALL process to cause the state of a nonvolatile memory cell to be represented in a volatile memory cell of claim 5, wherein applying the current regulator to balance a potential between two nodes of a latch of the volatile memory cell further comprises:
   operating a pull up transistor coupled to a first one of the two nodes, and operating a pull down transistor coupled to a second one of the two nodes.

7. The RECALL process to cause the state of a nonvolatile memory cell to be represented in a volatile memory cell of claim 4, further comprising:
   applying a controlled current source to an input of the nonvolatile memory cell during the RECALL.

8. The RECALL process to cause the state of a nonvolatile memory cell to be represented in a volatile memory cell of claim 4, further comprising:
   adjusting a voltage at a gate of a nonvolatile charge storage transistor on the nonvolatile memory cell, the voltage at the gate adjusted to reduce a current detected flowing in the current regulator.

9. A memory circuit comprising:
   a first controlled current source coupled to an input to a nonvolatile cell; and
   a volatile cell coupled to receive current from the first controlled current source via the nonvolatile cell;
   the first controlled current source adapted to provide a substantially constant amount of current to the volatile cell via the nonvolatile cell, notwithstanding changes in an impedance of the load presented by one or more of the volatile cell and the nonvolatile cell.

10. The memory circuit of claim 9, further comprising:
    a second controlled current source coupled to the volatile cell, the second current source coupled to reduce potentials between at least two nodes of a latch of the volatile cell.

11. The memory circuit of claim 10, wherein the second controlled current source coupled to the volatile cell further comprises:
    at least one pull up transistor and at least one pull down transistor.

* * * * *

UNITED STATES PATENT AND TRADEMARK OFFICE
CERTIFICATE OF CORRECTION

| | |
|---|---|
| PATENT NO. | : 8,817,536 B2 |
| APPLICATION NO. | : 12/006228 |
| DATED | : August 26, 2014 |
| INVENTOR(S) | : Andreas Scade et al. |

It is certified that error appears in the above-identified patent and that said Letters Patent is hereby corrected as shown below:

On the Title Page

Item (75) Inventor Name

Allen; James should be corrected to

Allan; James

Signed and Sealed this
Twenty-fifth Day of August, 2015

Michelle K. Lee
*Director of the United States Patent and Trademark Office*